(12) United States Patent
Bielmeier et al.

(10) Patent No.: US 7,474,877 B2
(45) Date of Patent: Jan. 6, 2009

(54) METHOD FOR MONITORING AN RF POWER AMPLIFIER, AND AN RF DEVICE, A MONITORING DEVICE, AND AN MR SYSTEM CORRESPONDING THERETO

(75) Inventors: Wolfgang Bielmeier, Nürnberg (DE); Klaus Ludwig, Nürnberg (DE)

(73) Assignee: Siemens Aktiengesellschaft, Munich (DE)

( * ) Notice: Subject to any disclaimer, the term of this patent is extended or adjusted under 35 U.S.C. 154(b) by 699 days.

(21) Appl. No.: 11/055,049

(22) Filed: Feb. 10, 2005

(65) Prior Publication Data

US 2005/0260955 A1 Nov. 24, 2005

(30) Foreign Application Priority Data

Feb. 10, 2004 (DE) .................. 10 2004 006 550

(51) Int. Cl.
*H04B 1/04* (2006.01)
*H04B 17/00* (2006.01)

(52) U.S. Cl. ............... 455/115.1; 455/67.11; 455/114.3

(58) Field of Classification Search ............. 455/67.11, 455/115.1, 114.3, 67.13, 296, 310, 311, 501, 455/341; 324/307, 309, 314, 300, 308, 322
See application file for complete search history.

(56) References Cited

U.S. PATENT DOCUMENTS

| | | | | |
|---|---|---|---|---|
| 4,760,336 A | * | 7/1988 | Conolly | 324/309 |
| 6,426,623 B1 | * | 7/2002 | Bernstein | 324/314 |
| 6,759,847 B2 | * | 7/2004 | Brinker et al. | 324/309 |
| 6,762,605 B2 | | 7/2004 | Brinker et al. | |
| 7,078,900 B2 | * | 7/2006 | Vu | 324/314 |
| 7,187,172 B2 | * | 3/2007 | Bielmeier et al. | 324/314 |
| 7,218,106 B2 | * | 5/2007 | Yasuhara et al. | 324/307 |
| 7,340,225 B2 | * | 3/2008 | Bielmeier et al. | 455/115.1 |
| 7,342,398 B2 | * | 3/2008 | Bielmeier et al. | 324/314 |

* cited by examiner

*Primary Examiner*—Sonny Trinh
(74) *Attorney, Agent, or Firm*—Schiff Hardin LLP

(57) ABSTRACT

In a method for monitoring a radio-frequency power amplifier, and a radio-frequency device, and a radio-frequency monitoring device and a magnetic resonance tomography system, radio-frequency pulses are emitted at temporal intervals by the radio-frequency power amplifier, and measurement values that represent the power of the radio-frequency pulses are measured at temporal intervals. The measurement values are respectively loaded with a measurement error. Control values are respectively formed based on the sum of a number of measurement values loaded with measurement errors, and the radio-frequency power amplifier is limited in operation if and when a control value reaches or exceeds a predetermined limit control value.

14 Claims, 2 Drawing Sheets

METHOD FOR MONITORING AN RF POWER AMPLIFIER, AND AN RF DEVICE, A MONITORING DEVICE, AND AN MR SYSTEM CORRESPONDING THERETO

BACKGROUND OF THE INVENTION

1. Field of the Invention

The present invention concerns a method for monitoring a radio frequency power amplifier, as well as a corresponding radio-frequency device, a corresponding radio-frequency monitoring device and a corresponding magnetic resonance tomography system.

2. Description of the Prior Art

Magnetic resonance tomography is an imaging modality now in widespread use that is based on the detection of signals arising from precessing nuclear spins of protons in a body region of an examination subject. First, a strong, stable homogenous magnetic field is generated in which the body region is disposed, which causes a stable alignment of the protons in the body region. This stable alignment is altered by radiating electromagnetic radio frequency energy into the region. After this excitation the magnetic resonance signals created in the body are detected with suitable receiver coils. The signals are processed are processed and an image of the tissue in this body region is reconstructed therefrom, with which a medical diagnosis can be made, or a surgical procedure can be planned or guided.

A magnetic resonance tomography system has a number of interacting components, each of which requires the use of modern and elaborate technologies. A central component of a magnetic resonance tomography system is the radio frequency device. This is responsible for the generation of the radio frequency pulses that are radiated into the body region to be imaged. The radio frequency pulses at the output of a radio frequency power amplifier of a magnetic resonance tomography system are conducted via a measurement device to a transmission coil that radiates the radio frequency pulses into the body region. As used herein "transmission coil", means any antenna device with which the radio frequency pulses can be radiated.

With the development and establishment of magnetic resonance tomography systems, limit values to ensure patient safety have been standardized that regulate the maximum permissible radio-frequency irradiation into a human body. A typical limit value for this is the maximum allowable SAR value (SAR=specific absorption rate).

To abide by these limit values, in the measurement device cited above, measurement values are recorded that represent the power of the radio frequency pulses radiated by the transmission coil. Control values are formed on the basis of a number of such measurement values. These control values are then compared with a fixed threshold (limit control value) that is predetermined by a standard, and the radio frequency power amplifier is automatically limited in operation (usually deactivated) if and when a control value exceeds the predetermined threshold.

To take into consideration system-dependent measurement errors, it is known to subtract a system error from the predetermined threshold and to compare the effective threshold thus obtained with the control values to monitor the radio-frequency power amplifier.

Investigations have shown that each individual measurement is afflicted with at least the following three measurement errors of different types:

errors via directivity of the directional coupler,
calibration errors and
linearity errors.

The directivity error depends on the degree of the reflection and is dependent on the load of the transmission coil, i.e. it is dependent on how much mass is presently located in the transmission coil. The degree of the reflection is determined by an adjustment measurement before a measurement period. Both of the last types of errors are dependent on the magnitude of the measurement value, and the error curve is non-proportional, such that given small measurement values the relative measurement error is larger than given large measurement values.

Conventional methods account (as described above) for the cited errors by subtracting an all-inclusive system error from the threshold in a later processing stage, independent of the individual measurement values. Given the determination of this system error, the measurement errors of the individual measurements and the measurement values of the individual measurements are not known. Therefore, for the existence of safety, at least some larger measurement errors has to be assumed in the determination of the system errors. This leads to the assumption of a larger system error than actually exists. The assumption of an unnecessarily small effective threshold results from this, which can lead to an unnecessarily premature deactivation of the radio-frequency power amplifier as a result.

The system errors introduced into the effective threshold are thus taken as a whole, such that a deactivation of the radio-frequency power amplifier frequently also ensues when the actual radio-frequency irradiation in a body region is still far removed from the legal threshold. However, a lower radio-frequency power in the measurement leads directly to a reduced dynamic range and consequently leads to a quality loss in the generated exposure.

SUMMARY OF THE INVENTION

It is an object of the present invention to provide a method and associated components and system monitoring a radio-frequency power amplifier that prevent the radiated radio-frequency power from exceeding a threshold while enabling that the actual radiated radio-frequency power to be near the threshold.

The invention is based on the recognition that conventional methods as described above for monitoring a radio-frequency power amplifier frequently unnecessarily lead to a deactivation of the radio-frequency power amplifier. As explained above, this is due to the determination and use of an effective threshold that is in turn based on the determination and use of a globalized system error.

Based on this recognition, in accordance with the invention measurement values are repeatedly acquired that represent the power of radio-frequency pulses repeatedly transmitted by the radio-frequency power amplifier via a transmission coil. The individual measurement values respectively loaded (skewed) with a measurement error. Based on the sum of a number of measurement values loaded with measurement errors, control values are formed and the radio-frequency power amplifier is limited in operation if and when a control value reaches or exceeds a predetermined limit control value.

The individual measurement values thus already exhibit a measurement error before they are further processed into a control value in which the individual measurement values "disappear". An error consideration in a later processing stage, for example via the determination of an effective threshold, is no longer necessary.

The presence of measurement value-dependent measurement errors, enables a more exact consideration of measurement errors, which leads to an unnecessary operational limitation of the radio-frequency power amplifier being prevented, or at least ensuing less frequently in comparison with the prior art.

If, for example, information about the dependency between a measurement value and the expected measurement error exists, the individual measurement value can be loaded with the expected measurement error associated with it. For this purpose, the information about the dependency between measurement value and expected measurement error preferably are stored, for example in the form of an error curve. The error curve can be adapted to the current measurement conditions from time to time.

The temporal interval between the radio-frequency pulses and the temporal interval between the measurements can, incidentally, be the same or different. Generally, an emitted radio-frequency pulse is scanned sampled multiple times.

Given the use of the invention in the framework of a magnetic resonance tomography system, primarily the radio-frequency exposure for the patient should be monitored. It is therefore reasonable to use measurement values that represent the power delivered to the transmission coil or the power radiated by the transmission coil. The measurement values therefore are preferably respectively based on the difference between the delivery power delivered by the radio-frequency amplifier to the transmission coil and the return power returning from the transmission coil.

Since measurement values that directly represent the power emitted by the radio-frequency amplifier also indirectly represent the resulting power remaining in the transmission coil, in principle only the power emitted by the radio-frequency amplifier or a corresponding measurement value could be used in a simpler exemplary embodiment.

Limitation of the operation of the radio-frequency power amplifier can ensue in the inventive method, for example, by a shut-off of the radio-frequency power amplifier, a temporary deactivation of the radio-frequency power amplifier or a reduction of the transmission power of the radio-frequency power amplifier.

The average value of the measurement values loaded with the expected measurement errors preferably is formed as a control value, based on the sum of a number of measurement values loaded with measurement errors. Such a measurement value is a good indicator for the radiation exposure to which a patient is exposed, in particular in connection with magnetic resonance tomography systems.

The number of measurement values loaded with measurement errors is preferably selected using a time window that slides in the time range over the measurement values loaded with measurement errors. The control values used for the comparison with a threshold, which are respectively based on a number of measurement values loaded with measurement errors, thereby very promptly reflect the actual radiation exposure for a patient, for example in a magnetic resonance tomography system.

The invention also concerns a radio-frequency device with a radio-frequency power amplifier that emits radio-frequency pulses, with a measurement device to measure measurement values that represent the power of the radio-frequency pulses, and with a radio-frequency monitoring device that is coupled with the radio-frequency power amplifier and the measurement device.

The radio-frequency monitoring device, which can be executed as a processor device, is operated (preferably programmed) such that the measurement values are respectively loaded with a measurement error. A control value is respectively formed based on a number of measurement values loaded with measurement errors. The radio-frequency power amplifier is limited in operation when a control value reaches or exceeds the associated limit control value.

A radio-frequency monitoring device in accordance with the invention has a measurement value input for measurement values and a monitoring signal output for monitoring signals. The radio-frequency monitoring device is configured such that measurement values incoming from a measurement device, which represent the power of the radio-frequency pulses emitted by a radio-frequency power amplifier, are respectively loaded with a measurement error. A control value is respectively formed based on the sum of a number of measurement values loaded with measurement errors. A monitoring signal which effects a limitation of operation of a radio-frequency power amplifier is output to the monitoring signal output when a control value reaches or exceeds a predetermined limit control value.

The measured measurement values can be loaded with corresponding measurement errors in their original form or in a pre-processed form, i.e. for example after an analog-digital conversion and/or a conversion of effective RMS voltages (in the difference from delivery power and return power or the like).

The invention also concerns a magnetic resonance tomography system that contains the radio-frequency device specified above. In addition, the magnetic resonance tomography system includes all typical components such as, for example, a magnet system to generate a basic magnetic field, a gradient system with a number of gradient coils to apply magnetic field gradients, a radio-frequency transmission system with transmission coils, a radio-frequency reception system with reception coils, a suitable reception amplifier and an image computer. For example, the transmission coils can also serve as reception coils.

DESCRIPTION OF THE PREFERRED EMBODIMENTS

Figure 1:
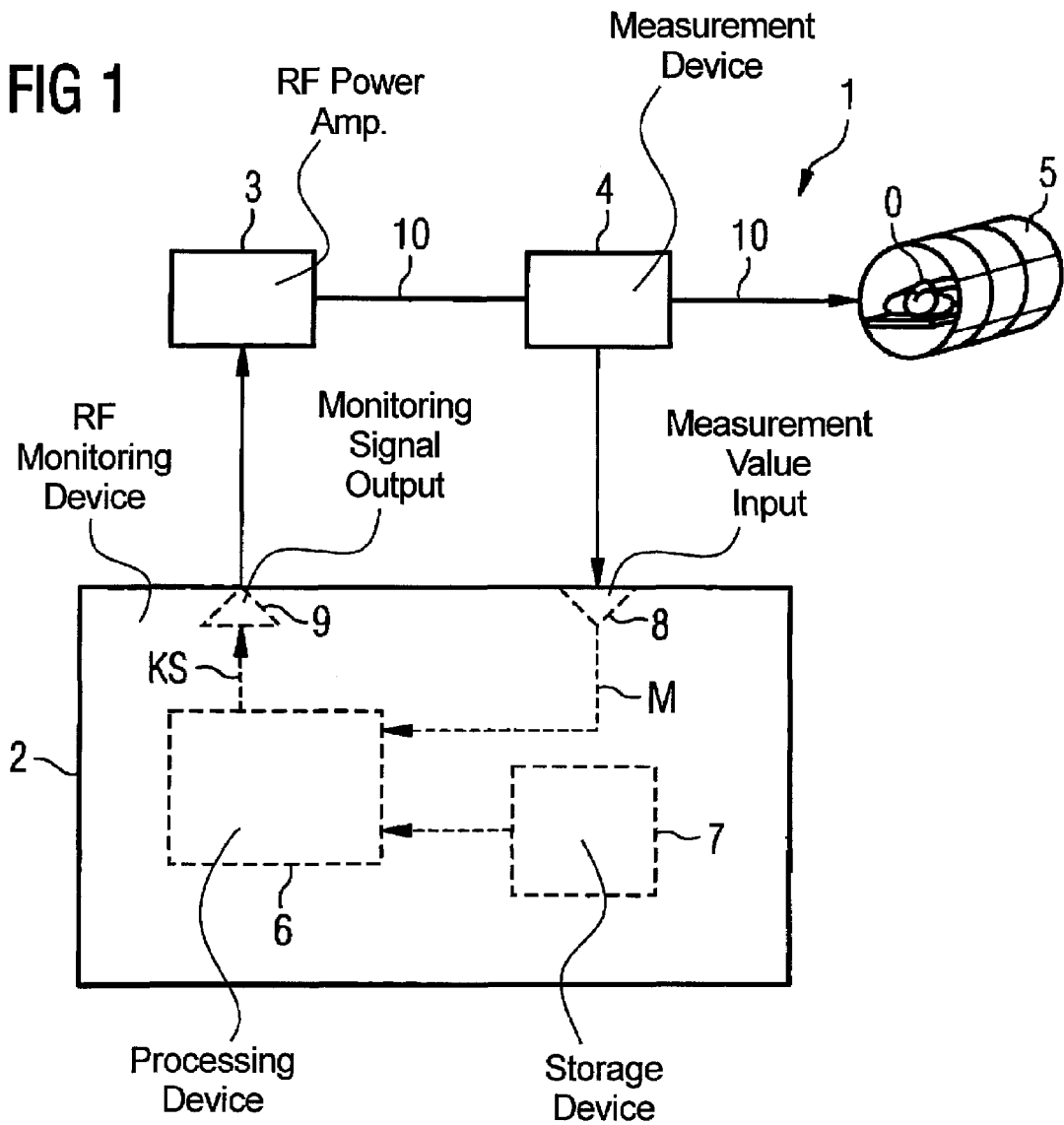
FIG. 1 is a basic block circuit diagram of a radio-frequency device of a magnetic resonance tomography system, constructed and operating in accordance with the invention.

As a basic component of a magnetic resonance tomography system, FIG. 1 shows a radio frequency device 1. The representation shown in FIG. 1 concentrates on the transmission branch of the radio frequency device 1.

In addition to the transmission branch of the radio frequency device 1, the magnetic resonance tomography system has a magnet system (not shown) for generation of a basic magnetic field in which at least a part of a patient is disposed during an examination, as well as gradient coils (not shown) to apply magnetic gradient fields. Moreover, a radio frequency reception system (not shown) is provided, with a reception coil and a suitable reception amplifier. The transmission coil can also form the reception coil. An image computer (not shown) reconstructs images from the received signals for display, for example on a screen, and/or for storage in a memory. A control computer (not shown) serves for coordination of the interaction of the individual components.

The radio frequency device 1 includes a radio frequency power amplifier 3 that emits radio frequency pulses H preferably in a power range between 10 W and 20 kW. The radio frequency pulses H are conducted via a transmission cable 5 to a measurement device 4. From the measurement device 4, the radio frequency pulses are conducted to a transmission coil 7 that radiates the radio frequency pulses into the body region of a patient O.

The measurement device 4 is shown in the exemplary embodiment as a sensor, in particular a transmit antenna level sensor (TALES), and has directional couplers to decouple a small part of the delivery power delivered by the radio frequency amplifier 3 to the transmission coil 7 and a small part of the return power returning from the transmission coil 7, which are then respectively converted into voltages. The radio frequency voltage measured in this manner can be between 0 and 1000 volts.

The measured values, if applicable, are supplied by the measurement device 4 to a radio frequency monitoring device 2 via a measurement value input 12 after an analog-digital conversion and/or other pre-processing. The radio frequency monitoring device 2 includes a processing device 9 together with a digital signal processor.

If a measurement value M or a control value K based thereupon exceeds a predetermined limit control value GK, a monitoring signal KS that effects at least a temporary deactivation of the radio-frequency power amplifier 3 is output at the monitoring signal output 9.

According to a preferred embodiment, the measurement values M that are inventively processed represent the power effectively radiated by the transmission coil 5, thus the difference between the delivery power and the return power which, for example, is determined every 20 µs by the monitoring device 2 or the processor device 6 based on the measured effective voltages.

Program data, a limit control value and information about a dependency between measurement value M and expected measurement error are stored in a storage device 7 (shown in FIG. 2) accessible by the processor device 6.

Figure 2:
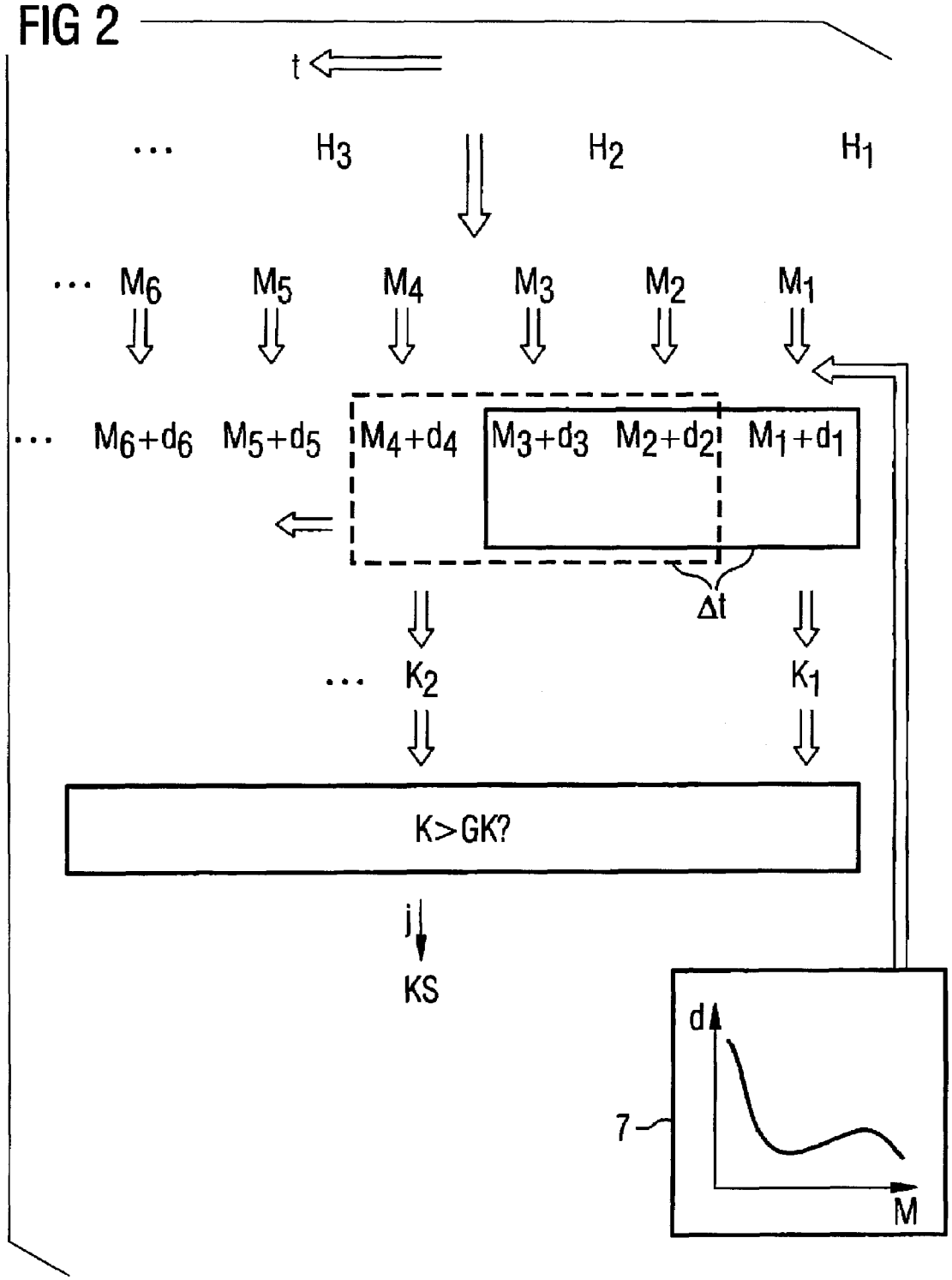
FIG. 2 is a simplified flow chart of an embodiment of the inventive method for monitoring of a radio-frequency power amplifier.

FIG. 2 shows a simplified flow chart of an exemplary embodiment of the inventive method. A number of radio-frequency pulses $H_1$ through $H_3$ that are emitted by the radio-frequency power amplifier 3 are initially shown along a time axis t.

Shown under these pulses are measurement values $M_1$ through $M_6$, likewise along the time axis t, which represent the power of the radio-frequency pulses H. A number of measurement values M are made for each radio-frequency pulse H.

The measurement values M are respectively loaded with measurement errors d associated with them based on information about the dependency between the measurement value M and an expected measurement error d (or expected maximum measurement error).

The information about the dependency between measurement value M and expected measurement error d (error curve) can be stored in the storage device 7 and be updated from time to time, dependent on the measurement environment.

A number of measurement values M, each loaded with a measurement error d, are respectively selected using a window Δt sliding over the measurement values M loaded with a measurement error d in the time range and are further processed to form a control value K. Thus, for example, the number of measurement values $M_1+d_1$, $M_2+d_2$, $M_3+d_3$ loaded with a measurement error are selected by the sliding window Δt and are further processed to form the control value $K_1$. Likewise, a short time later the measurement values $M_2+d_2$, $M_3+d_3$, $M_4+d_4$ loaded with a measurement error are selected via the sliding window Δt and are further processed to form the control value $K_2$. The length of the window is preferably 10 s or 360 s. A short-term monitoring, for example with a 10 s window, and a long-term monitoring, for example with a 360 s window, preferably ensue.

In this example, the control value is determined from the selected number of measurement values M loaded with a measurement error d, by forming the average of the selected number of measurement values M loaded with a measurement error d.

Solely for simplicity, the selected number of measurement values M loaded with a measurement error d here is only three values. This number, however, is arbitrary and can depend on the current environment or the current examination, for example.

In a next processing stage, the control values K are then compared (K>GK?) with a limit control value predetermined by a standard. If a control value K is greater than a limit control value GK, a monitoring signal KS is thus output that initiates the deactivation of the radio-frequency power amplifier 3.

The limit control values GK in particular can be determined by the standard IEC 60601-2-23 "Medical Equipment—Particular requirements for the safety of magnetic resonance equipment for medical diagnosis", dependent on the body weight of the patient concerned.

In conclusion, it is again noted that the preceding method specified in detail as well as the shown radio frequency system and the radio frequency monitoring device are exemplary embodiments that can be modified by those skilled in the art in various ways without departing from the scope of the invention. In particular, the detection of the power measurement values can ensue in a manner different than in the described manner above. Furthermore, the determination of the power limit values can ensue not only dependent on environment parameters, but also dependent on other parameters. Although the invention has been described in the preceding examples using a magnetic resonance tomography system in the medical field, the invention also can be used in other areas, such for scientific and/or industrial magnetic resonance imaging systems or, for example, in mobile radio communication or in other types of radio-based communication.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for monitoring a radio-frequency power amplifier that emits radio-frequency pulses to a transmission coil at first temporal intervals, each of said radio-frequency pulses having a power, said method comprising the steps of:

obtaining a plurality of measurement values respectively at second temporal intervals representing the power of said radio-frequency pulses;

loading each of said measurement values with a measurement error;

forming a control value based on a sum of said plurality of measurement values respectively loaded with said measurement errors; and limiting operation of said radio-frequency power amplifier if and when said control value equals or exceeds a predetermined limit control value.

2. A method as claimed in claim 1 wherein the step of forming said control value comprises forming said control value as an average of said plurality of said measurement values respectively loaded with said measurement errors.

3. A method as claimed in claim 1 comprising obtaining each of said measurement values as a difference, at said second temporal intervals, between a delivery power emitted by said radio-frequency amplifier to said transmission coil and a return power returning from said transmission coil.

4. A method as claimed in claim 1 wherein each of said measurement values has a magnitude, and comprising, for each measurement value, formulating the respective measurement error therefor dependent on the magnitude of that measurement value.

5. A method as claimed in claim 4 comprising, for each of said measurement values, storing a dependency between the respective measurement error therefor and that measurement value, and loading each measurement value with the measurement error resulting from the stored dependency.

6. A method as claimed in claim 1 comprising obtaining said plurality of measurement values within a time range, and wherein said measurement values respectively loaded with measurement errors form a plurality of measurement values respectively loaded with measurement errors, and selecting measurement values respectively loaded with measurement errors, from among said plurality of measurement values respectively loaded with measurement errors, for inclusion in said sum for forming said control value by sliding a time window in said time range over said plurality of measurement values respectively loaded with measurement errors.

7. A method as claimed in claim 1 comprising setting said second temporal intervals equal to said first temporal intervals.

8. A radio-frequency device comprising:
   a radio-frequency power amplifier that emits radio-frequency pulses to a transmission coil at first temporal intervals, each of said radio-frequency pulses having a power;
   a measurement device that obtains a plurality of measurement values respectively at second temporal intervals representing the power of said radio-frequency pulses; and
   a processor that loads each of said measurement values with a measurement error and electronically forms a control value based on a sum of said plurality of measurement values respectively loaded with said measurement errors, and limits operation of said radio-frequency power amplifier if and when said control value equals or exceeds a predetermined limit control value.

9. A radio-frequency device as claimed in claim 8 comprising a transmission cable connecting said radio-frequency power amplifier and said transmission coil, via which said radio-frequency pulses are conducted to said transmission coil, said transmission cable comprising directional couplers for respectively coupling, out of said transmission cable, a part of a delivery power from said radio-frequency power amplifier to said transmission coil and a part of a return power from said transmission coil, and wherein said radio-frequency device forms each of said measurement values as a difference, at the respective second temporal intervals, as a difference between said part of said delivery power and said part of said return power.

10. A radio-frequency device as claimed in claim 8 wherein said measurement device operates with second temporal intervals equal to said first temporal intervals.

11. A device for monitoring a radio-frequency power amplifier that emits radio-frequency pulses to a transmission coil at first temporal intervals, each of said radio-frequency pulses having a power, said device comprising:
   a measurement device that obtains a plurality of measurement values respectively at second temporal intervals representing the power of said radio-frequency pulses;
   a processor that loads each of said measurement values with a measurement error, and electronically forms a control value based on a sum of said plurality of measurement values respectively loaded with said measurement errors, and limits operation of said radio-frequency power amplifier if and when said control value equals or exceeds a predetermined limit control value.

12. A device as claimed in claim 11 wherein said measurement device operates with said second temporal intervals equal to said first temporal intervals.

13. A magnetic resonance tomography system comprising:
   a magnetic resonance scanner, adapted to interact with an examination subject therein, to acquire magnetic resonance data from the examination subject;
   said magnetic resonance scanner including a radio-frequency power amplifier that emits radio-frequency pulses to a transmission coil at first temporal intervals, each of said radio-frequency pulses having a power;
   a measurement device that obtains a plurality of measurement values respectively at second temporal intervals representing the power of said radio-frequency pulses; and
   a processor that loads each of said measurement values with a measurement error, and electronically forms a control value based on a sum of said plurality of measurement values respectively loaded with said measurement errors, and limits operation of said radio-frequency power amplifier if and when said control value equals or exceeds a predetermined limit control value.

14. A system as claimed in claim 13 wherein said measurement device operates with said second temporal intervals equal to said first temporal intervals.

* * * * *